US012615904B2

(12) United States Patent
Diao et al.

(10) Patent No.: US 12,615,904 B2
(45) Date of Patent: Apr. 28, 2026

(54) PEROVSKITE SOLAR CELL HAVING HOLE TRANSPORT LAYER WITH COMB FIBER STRUCTURES AND PREPARATION METHOD THEREOF

(71) Applicant: LONGI GREEN ENERGY TECHNOLOGY CO., LTD., Xi'an (CN)

(72) Inventors: Yifan Diao, Xi'an (CN); Junjie Xie, Xi'an (CN); Zhao Wu, Xi'an (CN); Zifeng Li, Xi'an (CN); Zhuxing Sun, Xi'an (CN); Tong Liu, Xi'an (CN); Chen Xu, Xi'an (CN)

(73) Assignee: LONGi Green Energy Technology Co., Ltd., Xi'an (CN)

( * ) Notice: Subject to any disclaimer, the term of this patent is extended or adjusted under 35 U.S.C. 154(b) by 0 days.

(21) Appl. No.: 18/704,644

(22) PCT Filed: Jun. 7, 2022

(86) PCT No.: PCT/CN2022/097420
§ 371 (c)(1),
(2) Date: Apr. 25, 2024

(87) PCT Pub. No.: WO2023/071203
PCT Pub. Date: May 4, 2023

(65) Prior Publication Data
US 2025/0017030 A1     Jan. 9, 2025

(30) Foreign Application Priority Data

Oct. 25, 2021     (CN) .......................... 202111243277.3

(51) Int. Cl.
*H10K 30/86*      (2023.01)
*H10K 30/40*      (2023.01)
*H10K 85/10*      (2023.01)

(52) U.S. Cl.
CPC ............. *H10K 30/86* (2023.02); *H10K 30/40* (2023.02); *H10K 85/1135* (2023.02)

(58) Field of Classification Search
CPC ........ H10K 30/10; H10K 30/20; H10K 30/40; H10K 30/50; H10K 30/86; H10K 30/87;
(Continued)

(56) References Cited

U.S. PATENT DOCUMENTS

| | | | | |
|---|---|---|---|---|
| 2002/0153523 | A1* | 10/2002 | Bernius ................ | H10K 50/844 257/40 |
| 2009/0266418 | A1 | 10/2009 | Hu et al. | |
| 2017/0040560 | A1* | 2/2017 | Martinson ............. | H10F 77/311 |

FOREIGN PATENT DOCUMENTS

| | | |
|---|---|---|
| CN | 103642058 A | 3/2014 |
| CN | 105762168 B | 8/2018 |

(Continued)

OTHER PUBLICATIONS

JP 2018-085424 A English Translation provided by FIT database, translated on May 5, 2025.*

(Continued)

*Primary Examiner* — Golam Mowla
(74) *Attorney, Agent, or Firm* — Fish & Richardson P.C.

(57)     ABSTRACT

This application discloses a perovskite solar cell having a hole transport layer with comb fiber structures and a preparation method thereof. In one aspect, a perovskite solar cell includes a perovskite absorption layer, a transparent electrode layer and a hole transport layer with comb fiber structures that is on the transparent electrode layer. The hole transport layer with comb fiber structures includes a polythiophene-based polymer hole transport material.

17 Claims, 2 Drawing Sheets

(58) Field of Classification Search
CPC .. H10K 85/10; H10K 85/113; H10K 85/1135; H10K 85/50; H10K 71/12
See application file for complete search history.

(56) References Cited

FOREIGN PATENT DOCUMENTS

| CN | 109713132 | A | | 5/2019 | | |
|----|-----------|---|---|--------|---|---|
| CN | 111029470 | A | | 4/2020 | | |
| CN | 111785836 | A | | 10/2020 | | |
| CN | 112002813 | A | * | 11/2020 | ............ | H10K 85/50 |
| CN | 113394343 | A | | 9/2021 | | |
| CN | 116033763 | A | | 4/2023 | | |
| JP | 2001148330 | A | | 5/2001 | | |
| JP | 2003317814 | A | | 11/2003 | | |
| JP | 2011035243 | A | | 2/2011 | | |
| JP | 2015046298 | A | | 3/2015 | | |
| JP | 2018085424 | A | | 5/2018 | | |
| JP | 2021528509 | A | | 10/2021 | | |
| KR | 20180064858 | A | | 6/2018 | | |
| WO | WO 2015167228 | A1 | | 11/2015 | | |

OTHER PUBLICATIONS

CN 112002813 A English Translation provided by FIT database, translated on Dec. 4, 2025.*

Lu et al., "Synthesis of Submicron PEDOT Particles of High Electrical Conductivity via Continuous Aerosol Vapor Polymerization," ACS Applied Materials & Interfaces, Nov. 2019, 11(50):S1-S9, 10 pages.

Mali et al., "Nanoporous p-type NiOx electrode for p-i-n inverted perovskite solar cell toward air stability," Materials Today, Jun. 2018, 21(5):483-500.

International Search Report and Written Opinion in Appln. No. PCT/CN2022/097420, mailed on Aug. 29, 2022, 12 pages (with English translation).

International Preliminary Report on Patentability in International Appln. No. PCT/CN2022/097420, mailed on May 10, 2024, 10 pages (with English translation).

Communication pursuant to Rules 70(2) and 70a(2) EPC in European Appln.22885111.9, dated Feb. 4, 2025, 1 page.

Cong et al., "Fabrication of Nickel Oxide Nanopillar Arrays on Flexible Electrodes for Highly Efficient Perovskite Solar Cells," Nano Lett., Jun. 2019, 19(6):3676-3683.

Diao et al., "Direct Conversion of Fe2O3 to 3D Nanofibrillar PEDOT Micro supercapacitors," Advanced Functional Materials, Jun. 2020, 30(32):2003394, 22 pages.

Gharahcheshmeh et al., "Tuning, optimization, and perovskite solar cell device integration of ultrathin poly(3,4-ethylene dioxythiophene) films via a single-step all-dry process," Science Advances, Nov. 2019, 5(11), 12 pages.

Jiang et al., "Recent Advances of Synthesis, Properties, Film Fabrication Methods, Modifications of Poly(3,4-ethylenedioxythiophene), and Applications in Solution-Processed Photovoltaics," Adv. Funct. Mater., Sep. 2020, 30(51):2006213, 46 pages.

Levasseur et al., "Color Tuning by Oxide Addition in PEDOT:PSS-Based Electrochromic Devices," Polymers, Jan. 2019, 11:179, 12 pages.

Liang et al., "An all-inorganic perovskite solar capacitor for efficient and stable spontaneous photocharging," Nano Energy, Oct. 2018, 52:239-245.

Liu et al., "Halide Perovskites for Selective Ultraviolet-Harvesting Transparent Photovoltaics," Joule, Sep. 2018, 2(19):1827-1837.

Office Action in Chinese Appln. No. 202111243277.3, dated Mar. 14, 2025, 15 pages (with English translation).

Office Action in Japanese Appln. No. 2024-524623, dated Apr. 2, 2025, 10 pages (with English translation).

Ossila.com [online], "Safety Data Sheet, Revision #6," Jul. 20, 2023, retrieved on Apr. 2025, retrieved from URL<https://downloads.ossila.com/msds/pedot-pss-ai-4083.pdf>, 5 pages.

Solis-Cortes et al., "A solid-state integrated photo-supercapacitor based on ZnO nanorod arrays decorated with Ag2S quantum dots as the photoanode and a PEDOT charge storage counter-electrode," RSC Adv., Feb. 2020, 10:5812-5721.

Zhang et al., "Enhanced perovskite morphology and crystallinity for high performance perovskite solar cells using a porous hole transport layer from polystyrene nanospheres," Phys. Chem. Chem. Phys., Nov. 2016, 18:32903-32909.

Zhu et al., "Electrodeposited transparent PEDOT for inverted perovskite solar cells: improved charge transport and catalytic performances," Rare Met., Jan. 2021, 40(9):2402-2414.

* cited by examiner

PEROVSKITE SOLAR CELL HAVING HOLE TRANSPORT LAYER WITH COMB FIBER STRUCTURES AND PREPARATION METHOD THEREOF

CROSS-REFERENCE TO RELATED APPLICATIONS

This application is a National Stage of International Application No. PCT/CN2022/097420, filed on Jun. 7, 2022, which claims priority to Chinese Patent Application No. 202111243277.3, filed on Oct. 25, 2021. Both of the aforementioned applications are hereby incorporated by reference in their entireties.

TECHNICAL FIELD

This application relates to the technical field of solar cells, and particularly to a perovskite solar cell having a hole transport layer with comb fiber structures and a preparation method thereof.

BACKGROUND

In recent years, perovskite solar cells (PSC) have attracted great attention from academia and industry because of their rapidly increasing conversion efficiency, mature preparation technology and low cost. At present, the perovskite solar cells mainly have the following two structures according to a deposition substrate of a perovskite layer, where (1) the deposition substrate is an electron transport layer (ETL) and (2) the deposition substrate is a hole transport layer (HTL). The second type is also called inverted perovskite solar cell. The inverted perovskite solar cell is preferred in industry due to high stability, low processing temperature and simple preparation apparatus.

The hole transport layer of the inverted perovskite solar cell is often a thin film, and the holes excited by light in the perovskite layer are transported to the hole transport layer through a film interface, to generate a current. In this process, a contact area between the hole transport layer and the perovskite layer greatly determines the efficiency and stability of the solar cell. The larger the contact area is, the stronger the ability to transport holes will be, and the lower the recombination efficiency of electrons and holes excited by light will be, thereby improving the efficiency and stability of the solar cell.

Japanese Patent Publication No. JP2011035243A discloses an organic photoelectric conversion element, which includes two electrode layers, a P-type semiconductor absorption layer and an N-type semiconductor absorption layer. The hole transport layer is made of PEDOT:PSS, and is the only commercialized polymeric hole transport layer due to the water solubility imparted by PSS. The hole transport layer is spin coated between the P-type semiconductor absorption layer and the N-type semiconductor absorption layer. In the patent application, the P-type semiconductor absorption layer is a comb-structure layer serving to increase a contact area of a PN junction. However, the recombination of electrons and holes cannot be effectively avoided by the increased contact area of the PN junction. In addition, in the process of hole transport, only PEDOT is responsible for the hole transport, and PSS merely serves as an insulating material to provide water solubility, which greatly restricts the efficiency of hole transport, thereby reducing the efficiency of the solar cell. Moreover, the water absorption of PSS leads to the destruction of the perovskite layer due to environmental corrosion, which reduces the lifetime of PSC. At present, PSS cannot be completely removed by secondary dissolution with an organic solvent such as dimethyl sulfoxide (DMSO), dimethylformamide (DMF) and ethylene glycol (EG).

SUMMARY

To solve the technical problems existing in the related art, this application provides a perovskite solar cell having a hole transport layer with comb fiber structures and a preparation method thereof. In the perovskite solar cell, a contact area between a perovskite absorption layer and the hole transport layer is increased, to reduce the recombination of electrons and holes; and the hole transport layer with comb fiber structures containing no PSS is used, to increase the hole transport rate, thereby improving the efficiency and the lifetime of the solar cell.

According to a first aspect of this application, a perovskite solar cell is provided. The perovskite solar cell includes a transparent electrode layer and a hole transport layer with comb fiber structures formed on the transparent electrode layer. The hole transport layer with comb fiber structures is made of a polythiophene-based polymer hole transport material.

Optionally, the polythiophene-based polymer hole transport material is one or two or more selected from PEDOT, P3HT, P3OHT, and P3ODDT.

Optionally, the hole transport layer with comb fiber structures includes a thin film layer and comb fiber structures. A thickness of the thin film layer is 50-200 nm, and a length of the comb fiber structures is 500-1500 nm.

Optionally, the polythiophene-based polymer hole transport material is obtained by vapor polymerization of a thiophene-based hole transport material monomer.

Optionally, the polythiophene-based polymer hole transport material is prepared by a method comprising the following steps:

depositing an oxidant on the transparent electrode layer; and contacting a solution containing a strongly polar acid and a thiophene-based hole transport material monomer with the oxidant and reacting to obtain the hole transport layer with comb fiber structures.

Optionally, the thiophene-based hole transport material monomer is one or two or more selected from 3,4-ethylenedioxy thiophene. 3-hexylthiophene, 3-hexyloxythiophene, and 3-dodecyloxythiophene.

Optionally, a thickness of the oxidant deposited on the transparent electrode layer is 10-60 nm.

Optionally, after the solution containing a strong acid and a thiophene-based hole transport material monomer is contacted with the oxidant and reacted, the method further includes a step of rinsing the hole transport layer with comb fiber structures with a Lewis acid to remove the impurities.

Optionally, the hole transport layer with comb fiber structures is doped by using an acidic solution or an acidic gas to obtain a doped hole transport layer with comb fiber structures.

Optionally, the perovskite solar cell further includes a perovskite absorption layer, an electron transport layer and an electrode layer. The perovskite absorption layer is provided on the hole transport layer with comb fiber structures, and the electron transport layer and the electrode layer are provided on the perovskite absorption layer in sequence.

Optionally, the perovskite absorption layer extends into gaps between the comb structures of the hole transport layer to form an embedded structure.

Optionally, a thickness of the hole transport layer with comb fiber structures is smaller than a thickness of the perovskite absorption layer.

Optionally, a safe distance between the electron transport layer and a tip of the comb fiber structures in the hole transport layer with comb fiber structures is not less than 10 nm.

Optionally, a diameter of a single comb fiber in the hole transport layer with comb fiber structures is 100-1000 nm, and the single comb fiber has a rough surface.

According to a second aspect of this application, a method for manufacturing a perovskite solar cell is provided, which includes the following steps:

depositing an oxidant on a transparent electrode layer;
contacting a solution containing a strongly polar acid and a thiophene-based hole transport material monomer with the oxidant and reacting to obtain a hole transport layer with comb fiber structures; and
synthesizing a perovskite absorption layer on the hole transport layer with comb fiber structures, and then providing an electron transport layer and an electrode layer on the perovskite absorption layer in sequence.

Optionally, a thickness of the oxidant deposited on the transparent electrode layer is 10-60 nm.

Optionally, the thiophene-based hole transport material monomer is one or two or more selected from 3,4-ethylene-dioxythiophene, 3-hexylthiophene, 3-hexyloxythiophene, and 3-dodecyloxythiophene.

Optionally, a perovskite solution is spin coated on the hole transport layer, enabling the perovskite absorption layer to extend into gaps between the comb structures.

Optionally, a perovskite precursor is vapor deposited on the hole transport layer, enabling the perovskite precursor to synthesize the perovskite absorption layer that extends into gaps between the comb structures.

The above description is merely summary of the technical solutions of this application. For better understanding of the technical means provided in this application, the technical means can be implemented according to the disclosure in the specification. Furthermore, to make the above and other objectives, features and advantages of this application more comprehensible, specific implementations of this application are exemplified below.

Beneficial Effects of the Present Invention

The solar cell according to this application has a hole transport layer with uniform and high-density comb fiber structures, resulting in an increased contact area between the hole transport layer and the absorption layer. Moreover, because the hole transport layer is not prepared by spin coating of an aqueous solution, the insulating material PSS in the traditional hole transport polymer material is removed, and the transport efficiency of the hole transport layer is increased. The hole transport layer of the solar cell of this application has comb fiber structures, which increase the contact area between the hole transport material and the photovoltaic absorption layer and shorten the hole transport distance, thereby reducing the recombination of electron-hole pairs and improving the efficiency and lifetime of the solar cell.

According to the solar cell of this application, the hole transport layer with comb fiber structures is prepared with a thiophene-based hole transport material monomer without adding PSS required in the traditional preparation of a hole transport layer, thereby increasing the transport efficiency of the hole transport layer.

BRIEF DESCRIPTION OF THE DRAWINGS

To describe the technical solutions in the embodiments of this application or in related art more clearly, the following briefly introduces the accompanying drawings required for describing the embodiments or the related art. Apparently, the accompanying drawings in the following description show only some embodiments of this application, and a person of ordinary skill in the art may still derive other drawings from these accompanying drawings without creative efforts.

Figure 1:
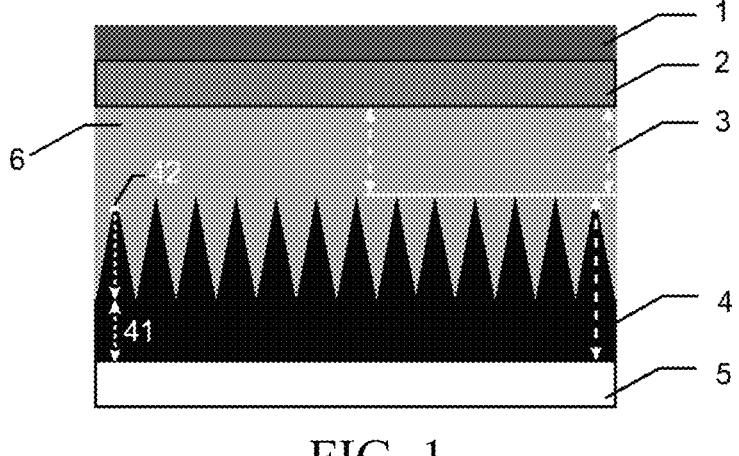
FIG. 1 is a schematic cross-sectional view of a perovskite solar cell.

In the drawings, 1—metal electrode layer, 2—electron transport layer, 3—safe distance, 4—hole transport layer with comb fiber structures, 5—transparent electrode layer, 6—perovskite absorption layer, 7—ferric oxide layer, 8—$FeCl_2$ impurities.

DETAILED DESCRIPTION

To make the objects, technical solutions and advantages of the embodiments of this application clearer, the technical solutions in the embodiments of this application will be clearly and completely described below in conjunction with the drawings in the embodiments of this application. Apparently, the described embodiments are some, rather than all embodiments of this application. All other embodiments obtained by a person of ordinary skill in the art based on the embodiments of this application without making creative efforts shall fall within the protection scope of this application.

It should be noted that some words are used in the specification and claims to refer to specific components. It should be understood by those skilled in the art that the same component may be referred to by the technicians using different nouns. The components are not distinguished by the difference of nouns, but by the difference of components in function. As mentioned throughout the specification and claims, "comprising" or "including" is an open term, and should be interpreted as "including but not limited to". Preferred embodiments for implementing this application are described later in the specification. However, the description is provided for the purpose of explaining general principles of the specification and not intended to limit the scope of this application. The scope of protection of this application should be defined by the appended claims.

This application provides a perovskite solar cell. As shown in FIG. 1, the perovskite solar cell includes a transparent electrode layer 5 and a hole transport layer 4 with comb fiber structures formed on the transparent electrode layer. The hole transport layer 4 with comb fiber structures is made of a polythiophene-based polymer hole transport material.

According to this application, the hole transport layer is creatively prepared to have comb fiber structures, so that a contact area between the hole transport layer and a perovskite absorption layer is increased, and the recombination of electrons and holes is reduced. Moreover, the hole transport layer prepared in this application is prepared by vapor polymerization of a thiophene-based hole transport material monomer without adding the insulating material PSS required in the traditional preparation of a hole transport layer, thereby greatly improving the transport efficiency of the hole transport layer and improving the efficiency and lifetime of the solar cell.

The transparent electrode layer 5 is not particularly limited in this application, as long as corresponding functions can be achieved. For example, the transparent electrode layer can be fluorine-doped tin oxide (FTO), indium tin oxide (ITO), and aluminum-doped zinc oxide (AZO), etc.

In an embodiment, the polythiophene-based polymer hole transport material is one or two or more selected from PEDOT, P3HT, P3OHT, and P3ODDT, for example, one, two, three or four selected from PEDOT, P3HT, P3OHT, and P3ODDT.

In an embodiment, the hole transport layer 4 with comb fiber structures includes a thin film layer 41 and comb fiber structures 42. A thickness of the thin film layer 41 is 50-200 nm, and a length of the comb fiber structures 42 is 500-1500 nm.

For example, the thickness of the thin film layer 41 can be 50 nm, 60 nm, 70 nm, 80 nm, 90 nm, 100 nm, 110 nm, 120 nm, 130 nm, 140 nm, 150 nm, 160 nm, 170 nm, 180 nm, 190 nm, 200 nm or in any range therebetween.

The length of the comb fiber structures 42 can be 500 nm, 600 nm, 700 nm, 800 nm, 900 nm, 1000 nm, 1100 nm, 1200 nm, 1300 nm, 1400 nm, 1500 nm or in any range therebetween.

With such dimensions, the thinner the film thickness is, the higher the hole transport efficiency will be; and the longer the length of the comb fiber is, the larger the specific surface area per unit area and the larger the contact area with the perovskite absorption layer will be, which are more beneficial to hole transport. However, the thickness of the perovskite absorption layer is generally not more than 1500 nm, so the length of the comb fiber structures 42 needs to be controlled.

In an embodiment, the polythiophene-based polymer hole transport material is obtained by vapor polymerization of a thiophene-based hole transport material monomer.

Figure 2:
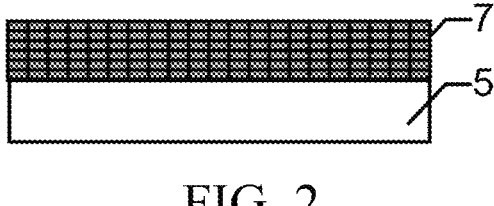
FIG. 2 is a schematic view showing a structure of a ferric oxide deposition layer.

In an embodiment, the polythiophene-based polymer hole transport material is prepared by a method comprising the following steps:

depositing an oxidant 7, preferably an oxidant with an oxidation potential of 0.7-1V, on the transparent electrode layer 5, as shown in FIG. 2; and contacting a solution containing a strongly polar acid and a thiophene-based hole transport material monomer with the oxidant 7 and reacting to obtain the hole transport layer 4 with comb fiber structures.

The reaction is a vapor synthesis reaction.

Preferably, no limitations are imposed on the oxidant with an oxidation potential of 0.7-1 V in this application, as long as corresponding functions can be realized. For example, the oxidant can be a substance containing ferric oxide, silver ions, (Ag+), OCl−, or OBr−.

No limitations are imposed on a thickness of the oxidant 7 deposited in this application, as long as the effect described can be achieved upon operation. For example, the deposited thickness is 10-60 nm, for example, 10 nm, 20 nm, 30 nm, 40 nm, 50 nm, 60 nm, or in any range therebetween.

The strongly polar acid is used to dissolve the oxidant mentioned above, for example, a substance containing ferric oxide. The strongly polar acid can be, for example, concentrated hydrochloric acid, concentrated nitric acid, formic acid, and acetic acid, etc.

Preferably, a volume of the strongly polar acid is 10-40 μL. For example, the volume of the strongly polar acid is 10 μL, 15 μL, 20 μL, 25 μL, 30 μL, 35 μL, 40 μL, or in any range therebetween.

Preferably, a volume of the thiophene-based hole transport material monomer is 100-300 μL. For example, the volume of the thiophene-based hole transport material monomer can be 100 μL, 110 μL, 120 μL, 130 μL, 140 μL, 150 μL, 160 μL, 170 μL, 180 μL, 190 μL, 200 μL, 210 μL, 220 μL, 230 μL, 240 μL, 250 μL, 260 μL, 270 μL, 280 μL, 290 μL, 300 μL or in any range therebetween.

Preferably, a concentration of the thiophene-based hole transport material monomer is 0.8-2M.

For example, the concentration of the thiophene-based hole transport material monomer can be 0.8 M, 0.9 M, 1.0 M, 1.1 M, 1.2 M, 1.3 M, 1.4 M, 1.5 M, 1.6 M, 1.7 M, 1.8 M, 1.9 M, 2.0 M or in any range therebetween.

Preferably, the solution containing a strong acid and a thiophene-based hole transport material monomer is an organic solution containing a strong acid and a thiophene-based hole transport material monomer, for example, a solution in benzene, a solution in chlorobenzene or a solution in toluene.

Preferably, the reaction temperature is 110-150° C. and the reaction time is 1-2 h.

The thiophene-based hole transport material monomer can be a hardly soluble thiophene-based hole transport material monomer or a soluble thiophene-based hole transport material monomer. For example, the hardly soluble thiophene-based hole transport material monomer can be 3,4-ethylenedioxythiophene (EDOT), and the soluble thiophene-based hole transport material monomer can be 3-hexylthiophene (3HT), 3-hexyloxythiophene (3OHT) or 3-decyloxythiophene (3ODDT).

According to this application, the hole transport layer with comb fiber structures is prepared with the thiophene-based hole transport material monomer in place of conventional PEDOT:PSS, to increase the hole transport rate, and thereby improve the efficiency and lifetime of the solar cell.

In an embodiment, after the solution containing a strongly polar acid and a thiophene-based hole transport material monomer is contacted with the oxidant and reacted, the method further includes a step of rinsing the hole transport layer 4 with comb fiber structures with a Lewis acid to remove the impurities.

No limitations are imposed on the Lewis acid in this application, as long as the impurities in the hole transport layer with comb fiber structures can be rinsed off. For example, the Lewis acid can be isopropanol (IPA), methanol, and ethanol, etc. For example, hydrochloric acid, preferably 6-12 M hydrochloric acid, is used for rinsing to obtain a neat hole transport layer 4 with comb fiber structures.

In an embodiment, the hole transport layer 4 with comb fiber structures is doped by using an acidic solution or an acidic gas to obtain a doped hole transport layer 4 with comb fiber structures.

For example, HCl, HBr, H2SO4 or other solutions or gases can be used to dope the hole transport layer 4 with comb fiber structures, with a maximum theoretical doping level of 33%.

The doping can be carried out by a person skilled in the art following a conventional method, to dope Cl–, Br– or SO42– into the hole transport layer 4 with comb fiber structures. Consequently, the hole transport rate is further enhanced by increasing the carrier concentration.

In an embodiment, the perovskite solar cell further includes a perovskite absorption layer 6, an electron transport layer 2 and an electrode layer 1 as shown in FIG. 1.

The perovskite absorption layer 6 is provided on the hole transport layer 4 with comb fiber structures, and then the electron transport layer 2 and the electrode layer 1 are provided on the perovskite absorption layer 6 in sequence.

The electrode layer 1 can be, for example, a metal electrode layer or a transparent electrode layer.

The perovskite absorption layer extends into gaps between the comb structures of the hole transport layer to form an embedded structure.

For the preparation of the perovskite absorption layer 6, the perovskite absorption layer 6 can be synthesized by a conventional perovskite preparation method (spin coating or vapor deposition). For example, a perovskite solution is spin coated on the hole transport layer, enabling the perovskite absorption layer to extend into gaps between the comb structures.

Because the solvent in the perovskite solution, such as DMF, DMSO, NMP and other polar solvents, has good wettability to the hole transport layer 4 with comb fiber structures, perovskite can form good contact with the thin film layer 41 and the comb fiber structures 42.

In addition, the perovskite absorption layer 6 can also be prepared by vapor deposition. For example, a perovskite precursor is vapor deposited on the hole transport layer, enabling the perovskite precursor to synthesize the perovskite absorption layer that extends into gaps between the comb structures.

The perovskite precursor can be, for example, PbI2 and formamidinium iodide (FAI). For example, the preparation method is as follows:
(1) PbI2 is vapor deposited on the hole transport layer, and then FAI is spin coated and reacted with PbI2, or (2) PbI2 and FAI are co-vapor deposited, to synthesize the perovskite layer in one step. Preferably, the vapor synthesis by co-vapor depositing PbI2 and FAI is used. Because the vapor molecules can easily penetrate into the thin film layer 41 and the comb fiber structures 42 to form good contact. Because of the vapor method that is not limited by comb fibers, the deposited perovskite layer is closely attached to the hole transport layer with comb fiber structures without gaps by electrical connection.

No limitations are imposed on the electron transport layer in this application. For example, the electron transport layer may be made of PCBM, graphene, tin dioxide (SnO2), tungsten oxide (WO3), titanium oxide (TiO2), vanadium oxide (VO2), and others.

No limitations are imposed on a thickness of the electron transport layer in this application, as long as the perovskite absorption layer is ensured not to contact with the electrode layer.

In an embodiment, the thickness of the hole transport layer 4 with comb fiber structures is less than the thickness of the perovskite absorption layer 6, to avoid the short circuit of the device caused by the contact between the comb fiber structures 42 and the electron transport layer 2. The thickness of the perovskite absorption layer 6 is a thickness commonly used by those skilled in the art, for example, generally 1500 nm or less.

In an embodiment, as shown in FIG. 1, a safe distance 3 between the electron transport layer 2 and a tip of the comb fiber structures 42 (that is, not including the layer thickness of the comb fibers) is not less than 10 nm, to avoid the short circuit of the device.

In an embodiment, as shown in FIG. 1, the perovskite solar cell includes a transparent electrode layer 5 and a hole transport layer 4 with comb fiber structures formed on the transparent electrode layer. The hole transport layer 4 with comb fiber structures is made of a polythiophene-based polymer hole transport material. The polythiophene-based polymer hole transport material is one or two or more selected from PEDOT, P3HT, P3OHT, and P3ODDT. The hole transport layer 4 with comb fiber structures includes a thin film layer 41 and comb fiber structures 42. A thickness of the thin film layer 41 is 50-200 nm, and a length of the comb fiber structures 42 is 500-1500 nm. The polythiophene-based polymer hole transport material is prepared by a method comprising the following steps: depositing an oxidant 7, preferably an oxidant with an oxidation potential of 0.7-1V, on the transparent electrode layer 5, as shown in FIG. 2; and contacting a solution containing a strongly polar acid and a thiophene-based hole transport material monomer with the oxidant 7 and reacting to obtain the hole transport layer 4 with comb fiber structures.

In an embodiment, as shown in FIG. 1, the perovskite solar cell includes a transparent electrode layer 5 and a hole transport layer 4 with comb fiber structures formed on the transparent electrode layer. The hole transport layer 4 with comb fiber structures is made of a polythiophene-based polymer hole transport material. The polythiophene-based polymer hole transport material is one or two or more selected from PEDOT, P3HT, P3OHT, and P3ODDT. The hole transport layer 4 with comb fiber structures includes a thin film layer 41 and comb fiber structures 42. A thickness of the thin film layer 41 is 50-200 nm, and a length of the comb fiber structures 42 is 500-1500 nm. The polythiophene-based polymer hole transport material is prepared by a method comprising the following steps: depositing an oxidant 7, preferably an oxidant with an oxidation potential of 0.7-1V, on the transparent electrode layer 5, as shown in FIG. 2; and contacting a solution containing a strongly polar acid and a thiophene-based hole transport material monomer with the oxidant 7 and reacting to obtain the hole transport layer 4 with comb fiber structures. A thickness of the hole transport layer 4 with comb fiber structures is less than a thickness of a perovskite absorption layer 6, and a safe distance 3 between an electron transport layer 2 and a tip of the comb fiber structures 42 (that is, not including the layer thickness of the comb fibers) is not less than 10 nm.

In an embodiment, as shown in FIG. 1, the perovskite solar cell includes a transparent electrode layer 5 and a hole transport layer 4 with comb fiber structures formed on the transparent electrode layer. The hole transport layer 4 with comb fiber structures is made of a polythiophene-based polymer hole transport material. The polythiophene-based polymer hole transport material is one or two or more selected from PEDOT, P3HT, P3OHT, and P3ODDT. The hole transport layer 4 with comb fiber structures includes a thin film layer 41 and comb fiber structures 42. A thickness of the thin film layer 41 is 50-200 nm, and a length of the comb fiber structures 42 is 500-1500 nm. The polythiophene-based polymer hole transport material is prepared by a method comprising the following steps: depositing an oxidant 7, preferably an oxidant with an oxidation potential of 0.7-1V, on the transparent electrode layer 5, as shown in FIG. 2; and contacting a solution containing a strongly polar acid and a thiophene-based hole transport material monomer with the oxidant 7 and reacting to obtain the hole transport layer 4 with comb fiber structures. A thickness of the hole transport layer 4 with comb fiber structures is less than a thickness of a perovskite absorption layer 6, and a safe distance 3 between an electron transport layer 2 and a tip of the comb fiber structures 42 (that is, not including the layer thickness of the comb fibers) is not less than 10 nm. Moreover, after the solution containing a strongly polar acid and a thiophene-based hole transport material monomer is contacted with the oxidant and reacted, the method further includes a step of rinsing the hole transport layer 4 with comb fiber structures with a Lewis acid to remove the impurities.

In an embodiment, as shown in FIG. 1, the perovskite solar cell includes a transparent electrode layer 5 and a hole transport layer 4 with comb fiber structures formed on the transparent electrode layer. The hole transport layer 4 with comb fiber structures is made of a polythiophene-based polymer hole transport material. The polythiophene-based polymer hole transport material is one or two or more selected from PEDOT, P3HT, P3OHT, and P3ODDT. The hole transport layer 4 with comb fiber structures includes a thin film layer 41 and comb fiber structures 42. A thickness of the thin film layer 41 is 50-200 nm, and a length of the comb fiber structures 42 is 500-1500 nm. The polythiophene-based polymer hole transport material is prepared by a method comprising the following steps: depositing an oxidant 7, preferably an oxidant with an oxidation potential of 0.7-1V, on the transparent electrode layer 5, as shown in FIG. 2; and contacting a solution containing a strongly polar acid and a thiophene-based hole transport material monomer with the oxidant 7 and reacting to obtain the hole transport layer 4 with comb fiber structures. A thickness of the hole transport layer 4 with comb fiber structures is less than a thickness of a perovskite absorption layer 6, and a safe distance 3 between an electron transport layer 2 and a tip of the comb fiber structures 42 (that is, not including the layer thickness of the comb fibers) is not less than 10 nm. Moreover, after the solution containing a strongly polar acid and a thiophene-based hole transport material monomer is contacted with the oxidant and reacted, the method further includes a step of rinsing the hole transport layer 4 with comb fiber structures with a Lewis acid to remove the impurities, and doping the hole transport layer 4 with comb fiber structures by using an acidic solution or an acidic gas to obtain a doped hole transport layer 4 with comb fiber structures.

In an embodiment, as shown in FIG. 1, the perovskite solar cell includes a transparent electrode layer 5 and a hole transport layer 4 with comb fiber structures formed on the transparent electrode layer. The hole transport layer 4 with comb fiber structures is made of a polythiophene-based polymer hole transport material. The polythiophene-based polymer hole transport material is one or two or more selected from PEDOT, P3HT, P3OHT, and P3ODDT. The hole transport layer 4 with comb fiber structures includes a thin film layer 41 and comb fiber structures 42. A thickness of the thin film layer 41 is 50-200 nm, and a length of the comb fiber structures 42 is 500-1500 nm. The polythiophene-based polymer hole transport material is prepared by a method comprising the following steps: depositing an oxidant 7, preferably an oxidant with an oxidation potential of 0.7-1V, on the transparent electrode layer 5, as shown in FIG. 2; and contacting a solution containing a strongly polar acid and a thiophene-based hole transport material monomer with the oxidant 7 and reacting to obtain the hole transport layer 4 with comb fiber structures. A thickness of the hole transport layer 4 with comb fiber structures is less than a thickness of a perovskite absorption layer 6, and a safe distance 3 between an electron transport layer 2 and a tip of the comb fiber structures 42 (that is, not including the layer thickness of the comb fibers) is not less than 10 nm. Moreover, after the solution containing a strongly polar acid and a thiophene-based hole transport material monomer is contacted with the oxidant and reacted, the method further includes a step of rinsing the hole transport layer 4 with comb fiber structures with a Lewis acid to remove the impurities, and doping the hole transport layer 4 with comb fiber structures by using an acidic solution or an acidic gas to obtain a doped hole transport layer 4 with comb fiber structures. The perovskite solar cell further includes a perovskite absorption layer 6, an electron transport layer 2 and an electrode layer 1. The perovskite absorption layer 6 is provided on the hole transport layer 4 with comb fiber structures, and then the electron transport layer 2 and the electrode layer 1 are provided on the perovskite absorption layer 6 in sequence. The perovskite absorption layer 6 penetrates into gaps between the comb fiber structures of the hole transport layer 4 to form an embedded structure.

Figure 5:
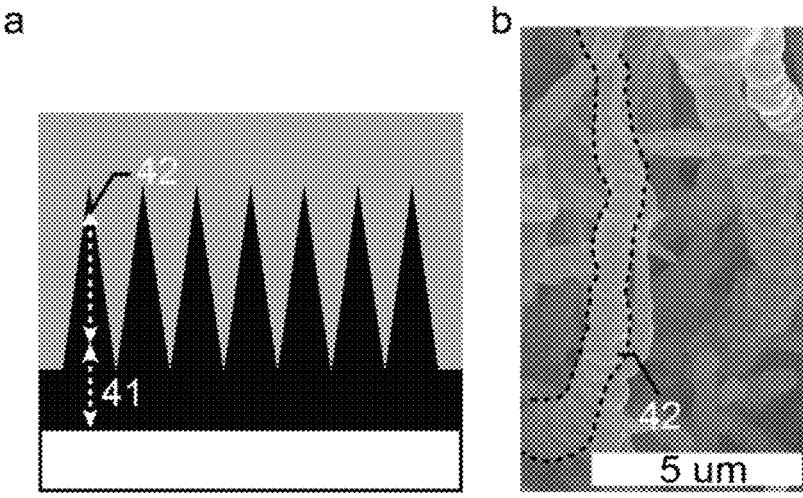
FIG. 5 is a schematic electron microscopy (EM) image of a single comb fiber in a hole transport layer, in which a schematically shows the single comb fiber in the hole transport layer, and B is a schematic EM image showing the morphology of the single comb fiber.

In an embodiment, a diameter of a single comb fiber in the hole transport layer with comb fiber structures is 100-1000 nm, and the single comb fiber has a rough surface (as shown in FIG. 5).

However, the number of single comb fibers per unit area and the specific surface area increase as the diameter of the single comb fiber decreases. Accordingly, the contact area between the hole transport layer and the perovskite absorption layer is increased, and the recombination of electrons and holes is reduced.

For example, the diameter of the single comb fiber can be 100 nm, 200 nm, 300 nm, 400 nm, 500 nm, 600 nm, 700 nm, 800 nm, 900 nm, 1000 nm or in any range therebetween.

According to the perovskite solar cell of this application, the hole transport layer with comb fiber structures is prepared with a thiophene-based hole transport material monomer, to increase the hole transport rate and improve the efficiency and lifetime of the solar cell. In addition, the use of the hole transport layer with comb structures increases the contact area between the perovskite absorption layer and the hole transport layer and reduces the recombination of electrons and holes.

The perovskite solar cell of this application is also applicable to other systems, for example, stacked solar cells based on perovskite solar cells, including, crystalline silicon-perovskite stacked solar cells, perovskite-perovskite stacked solar cells, and organic photovoltaic-perovskite stacked solar cells, etc., and also have good versatility and compatibility with dye-sensitized solar cells.

This application provides a method for preparing a perovskite solar cell, which includes the following steps:

depositing an oxidant on a transparent electrode layer;

contacting a solution containing a strongly polar acid and a thiophene-based hole transport material monomer with the oxidant and reacting to obtain a hole transport layer with comb fiber structures; and synthesizing a perovskite absorption layer on the hole transport layer with comb fiber structures, and then providing an electron transport layer and an electrode layer on the perovskite absorption layer in sequence.

A thickness of the oxidant deposited on the transparent electrode layer is 10-60 nm, and the thiophene-based hole transport material monomer is one or two or more selected from EDOT, 3HT, 3OHT and 3ODDT.

In an embodiment, a perovskite solution is spin coated on the hole transport layer, enabling the perovskite absorption layer to extend into gaps between the comb structures.

For example, a solution of PbI2 in N,N-dimethyl formamide or a mixed halide perovskite precursor is spin coated on the hole transport layer, enabling the synthesized perovskite absorption layer to extend into gaps between the comb structures to form an embedded structure.

In an embodiment, a perovskite precursor is vapor deposited on the hole transport layer, enabling the perovskite precursor to synthesize the perovskite absorption layer that extends into gaps between the comb structures.

The perovskite precursor can, for example, PbI2 and FAI. The preparation method is as follows: PbI2 and FAI are vapor deposited on the hole transport layer, and reacted in situ to synthesize a FAPbI3 thin film. The synthesize thin film (perovskite absorption layer) is thereby allowed to extend into gaps between the comb structure of the hole transport layer, to form an embedded structure.

The electrode layer can be, for example, a metal electrode layer or a transparent electrode layer.

The oxidant is an oxidant with an oxidation potential of 0.7-1 V, for example, the oxidant can be a substance containing ferric oxide, silver ions, (Ag+), OCl–, or OBr–.

The strongly polar acid can be, for example, concentrated hydrochloric acid, concentrated nitric acid, formic acid, and acetic acid, etc. A volume of the strongly polar acid can be, for example, 10-40 µL, and a volume of the thiophene-based hole transport material monomer can be 100-300 µL.

In the related art, the polythiophene-based hole transport material is insoluble in conventional solvents and thereby cannot be prepared by a conventional solvent method. When prepared by a conventional non-solvent method, a polythiophene-based hole transport material having only a layered structure, rather than comb fiber structures, can be prepared. In the method for preparing a perovskite solar cell according to this application, a hole transport layer with comb fiber structures is prepared with a thiophene-based hole transport material monomer, which increases the hole transport rate, and thereby increases the efficiency and lifetime of the solar cell.

EXAMPLES

The materials and test methods used in the tests are generally and/or specifically described in this application. In the following examples, % means wt %, that is, percentage by weight, unless otherwise specified. The reagents or instruments for which no manufacturers are noted are all common reagents and products commercially available from the market.

Example 1

As shown in FIG. 1, a hole transport layer 4 includes a 50 nm-thick PEDOT thin film layer 41 and 500 nm-long PEDOT comb fiber structures 42. A thickness of a perovskite absorption layer 6 is 600 nm, and a safe distance 3 is 50 nm. A diameter of a single PEDOT comb fiber structure is 100 nm, and the single PEDOT comb fiber structure has a rough surface by scanning by an electron microscope (JEOL 7001LVF FE-SEM), as shown in FIG. 5.

Figure 3:
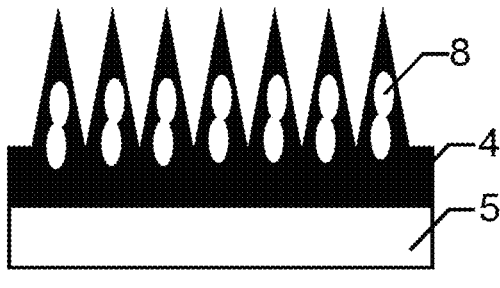
FIG. 3 is a schematic view of a hole transport layer containing $FeCl_2$ impurities.
Figure 4:
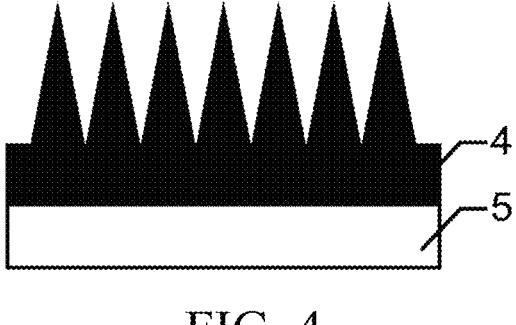
FIG. 4 is a schematic view of a neat hole transport layer.

Preparation Method of PEDOT Layer:

A 20 nm-thick ferric oxide layer 7 is deposited on a transparent electrode layer 5 by physical deposition (as shown in FIG. 2). 10 µL of concentrated hydrochloric acid and 100 µL of 1.56 M EDOT solution in chlorobenzene are added to a glass reactor and reacted with the ferric oxide layer 7 for 1.5 h at 130° C. Finally, a PEDOT thin film and PEDOT comb fiber structures containing the impurity FeCl2 are obtained (as shown in FIG. 3). Then, a neat hole transport layer with a PEDOT film and PEDOT comb fiber structures is obtained after being rinsed with 6 M HCl (as shown in FIG. 4).

Preparation of Perovskite Absorption Layer:

A 1 M PbI2 solution in N,N-dimethyl formamide is prepared, heated to 60° C. and continuously stirred for 30 min. The solution is spin coated for 20s on the hole transport layer at 5000 rpm and dried for 3 min and 5 min respectively at 50° C. and 100° C. To synthesize MAPbI3 perovskite, a 10 mg/mL MAI (CH3NH3I) solution in anhydrous isopropanol is introduced into the PbI2 film by spin coating for 20s at 2000 rpm. Finally, the film is rinsed with IPA to remove excess MAI, and dried for 5 min at 100° C. The perovskite absorption layer extends into gaps between the comb structures of the hole transport layer, to form an embedded structure with the hole transport layer.

The thin film layer 41 of the obtained hole transport layer 4 has a small thickness, and the comb fiber structures of the obtained hole transport layer 4 have a large aspect ratio, which facilitates the hole transport and improves the efficiency. The hole transport layer can form good contact with the perovskite absorption layer. Similar effects are also achieved in the following examples.

Example 2

As shown in FIG. 1, a hole transport layer 4 includes a 200 nm-thick PEDOT thin film layer 41 and 1200 nm-long PEDOT comb fiber structures 42. A thickness of a perovskite absorption layer 6 is 1500 nm, and a safe distance 3 is 100 nm. A diameter of a single PEDOT comb fiber structure is 200 nm, and the single PEDOT comb fiber structure has a rough surface, as shown in FIG. 5.

Preparation Method of PEDOT Layer:

A 60 nm-thick ferric oxide layer 7 is deposited on a transparent electrode layer 5 by physical deposition (as shown in FIG. 2). 40 µL of concentrated hydrochloric acid and 200 µL of 1.56 M EDOT solution in chlorobenzene are added to a glass reactor and reacted with the ferric oxide layer 7 for 2 h at 150° C. Finally, a PEDOT thin film and PEDOT comb fiber structures containing the impurity FeCl2 are obtained (as shown in FIG. 3). Then, a neat hole transport layer with a PEDOT film and PEDOT comb fiber structures is obtained after being rinsed with 12 M HCl (as shown in FIG. 4).

Preparation of Perovskite Absorption Layer:

At a vacuum level of 10-6 mbar, PbI2 and formamidinium iodide (FAI) with a purity of 99.999% are respectively heated to 200-300° C. and 80-150° C. By controlling the heating power of two crucibles, the deposition rate of PbI2 is maintained at 0.8 Å/s, and the deposition rate of FAI is maintained at 1.5 Å/s. They react in situ on the substrate to synthesize a FAPbI3 thin film. When the film thickness reaches 800 nm, the deposition is terminated. Then the deposited film is annealed at 150° C. for 15 min. The perovskite absorption layer extends into gaps between the comb structures of the hole transport layer, to form an embedded structure with the hole transport layer.

Example 3

As shown in FIG. 1, a hole transport layer 4 includes a 100 nm-thick P3HT thin film layer 41 and 800 nm-long P3HT comb fiber structures 42. A thickness of a perovskite absorption layer 6 is 1000 nm, and a safe distance is 100 nm. A diameter of a single P3HT comb fiber structure is 150 nm, and the single P3HT comb fiber structure has a rough surface, as shown in FIG. 5.

Preparation Method of P3HT Layer:

A 40 nm-thick ferric oxide layer 7 is deposited on a transparent electrode layer 5 by physical deposition (as shown in FIG. 2). 30 μL of concentrated hydrochloric acid and 300 μL of 1.2 M 3-hexylthiophene solution in chlorobenzene are added to a glass reactor and reacted with the ferric oxide layer 7 for 1 h at 150° C. Finally, a P3HT thin film and P3HT comb fiber structures containing the impurity FeCl2 are obtained (as shown in FIG. 3). Then, a neat hole transport layer with a P3HT film and P3HT comb fiber structures is obtained after being rinsed with 6 M HCl (as shown in FIG. 4).

The preparation method of the perovskite absorption layer is the same as that in Example 2.

Example 4

As shown in FIG. 1, a hole transport layer 4 includes a 50 nm-thick P3OHT thin film layer 41 and 950 nm-long P3OHT comb fiber structures 42. A thickness of a perovskite absorption layer 6 is 1000 nm, and a safe distance is 50 nm. A diameter of a single P3OHT comb fiber structure is 100 nm, and the single P3OHT comb fiber structure has a rough surface, as shown in FIG. 5.

Preparation Method of P3OHT Layer:

A 10 nm-thick ferric oxide layer 7 is deposited on a transparent electrode layer 5 by physical deposition (as shown in FIG. 2). 10 μL of concentrated hydrochloric acid and 100 μL of 1.56 M 3OHT solution in chlorobenzene are added to a glass reactor and reacted with the ferric oxide layer 7 for 2 h at 110° C. Finally, a P3OHT thin film and P3OHT comb fiber structures containing the impurity FeCl2 are obtained (as shown in FIG. 3). Then, a neat hole transport layer with a P3OHT film and P3OHT comb fiber structures is obtained after being rinsed with 6 M HCl (as shown in FIG. 4).

The preparation method of the perovskite absorption layer is the same as that in Example 2.

Example 5

As shown in FIG. 1, a hole transport layer 4 includes a 50 nm-thick P3ODDT thin film layer 41 and 900 nm-long P3ODDT comb fiber structures 42. A thickness of a perovskite absorption layer 6 is 1000 nm, and a safe distance is 100 nm. A diameter of a single P3ODDT comb fiber structure is 150 nm, and the single P3ODDT comb fiber structure has a rough surface, as shown in FIG. 5.

Preparation Method of P3ODDT Layer:

A 20 nm-thick ferric oxide layer 7 is deposited on a transparent electrode layer 5 by physical deposition (as shown in FIG. 2). 10 μL of concentrated hydrochloric acid and 100 μL of 1.56 M 3ODDT solution in chlorobenzene are added to a glass reactor and reacted with the ferric oxide layer 7 for 1.5 h at 130° C. Finally, a P3ODDT thin film and P3ODDT comb fiber structures containing the impurity FeCl2 are obtained (as shown in FIG. 3). Then, a neat hole transport layer with a P3ODDT film and P3ODDT comb fiber structures is obtained after being rinsed with 6 M HCl (as shown in FIG. 4).

The preparation method of the perovskite absorption layer is the same as that in Example 2.

Example 6

As shown in FIG. 1, a hole transport layer 4 includes a 50 nm-thick PEDOT thin film layer 41 and 550 nm-long PEDOT comb fiber structures 42. A thickness of a perovskite absorption layer 6 is 600 nm, and a safe distance is 50 nm. A diameter of a single PEDOT comb fiber structure is 50 nm, and the single PEDOT comb fiber structure has a rough surface, as shown in FIG. 5.

Preparation Method of PEDOT Layer:

The preparation method is the same as that in Example 1.

The preparation method of the perovskite absorption layer is the same as that in Example 2.

TABLE 1

| Performance parameters of perovskite solar cells prepared in the examples | | | | | | |
|---|---|---|---|---|---|---|
| | Example 1 | Example 2 | Example 3 | Example 4 | Example 5 | Example 6 |
| Thickness of thin film layer (nm) | PEDOT 50 | PEDOT 200 | P3HT 100 | P3OHT 50 | P3ODDT 50 | PEDOT 50 |
| Length of comb fiber structures (nm) | PEDOT 500 | PEDOT 1200 | P3HT 800 | P3OHT 950 | P3ODDT 900 | PEDOT 550 |
| Thickness of perovskite absorption layer (nm) | 600 | 1500 | 1000 | 600 | 600 | 600 |
| Safety distance (nm) | 50 | 100 | 100 | 50 | 50 | 50 |
| Diameter of single fiber structure (nm) | 100 | 200 | 150 | 100 | 1000 | 100 |

To sum up, in the perovskite solar cell of this application, PEDOT is used as a material of the hole transport layer with comb fiber structures, in which the thin film layer is thin and an aspect ratio of the fiber structures is large, facilitating the hole transport and improving the efficiency. Moreover, the hole transport layer with comb fiber structures is prepared with a thiophene-based hole transport material monomer, which increases the hole transport rates and thereby improves the efficiency and lifetime of the solar cell.

Preferred embodiments of this application are described above, which however are not intended to limit this application in any way. Equivalent embodiments can be obtained by any person of skill in the art by making equivalent changes or modifications to the disclosure above. However, any simple modifications, equivalent changes and modifications made to the above embodiments in accordance with the technical essence of this application and without departing from the technical solution of this application still fall within the scope of protection as defined by the claims of this application.

The foregoing described device embodiments are merely examples. The units described as separate parts may or may not be physically separate, and the parts displayed as units may or may not be physical units, may be located in one position, or may be distributed on a plurality of network units. Some or all of the modules may be selected according to actual needs to achieve the objectives of the solutions of the embodiments. A person of ordinary skill in the art can understand and implement the embodiments without creative efforts.

"An embodiment", "embodiments", or "one or more embodiments" mentioned herein means that particular features, structures, or characteristics described with reference to the embodiment is included in at least one embodiment of this application. In addition, it should be noted that the word "in an embodiment" here does not necessarily refer to the same embodiment.

Numerous specific details are set forth in the specification provided herein. However, it can be understood that the embodiments of this application can be practiced without the specific details. In some examples, known methods, structures, and technologies are not disclosed in detail, so as not to mix up understanding on the specification.

Finally, it should be noted that: the foregoing embodiments are merely used for describing the technical solutions of this application, but are not intended to limit this application. Although this application is described in detail with reference to the foregoing embodiments, it should be appreciated by a person skilled in the art that modifications can still be made to the technical solutions described in the foregoing embodiments, or equivalent replacements can be made to some of the technical features, as long as such modifications or replacements do not cause the essence of corresponding technical solutions to depart from the spirit and scope of the technical solutions of the embodiments of this application.

What is claimed is:

1. A solar cell, comprising a perovskite absorption layer, an electron transport layer, a transparent electrode layer and a hole transport layer on the transparent electrode layer, wherein the hole transport layer comprises a thin film layer and comb fiber structures on the thin film layer, wherein a height of a comb fiber structure of the comb fiber structures is greater than a diameter of the comb fiber structure, wherein the hole transport layer comprises a polythiophene-based polymer hole transport material, wherein the polythiophene-based polymer hole transport material is absent of PSS, wherein the diameter of the comb fiber structure is greater than a thickness of the thin film layer, and wherein a thickness of the perovskite absorption layer is greater than a distance between the electron transport layer and a tip of the comb fiber structures of the hole transport layer.

2. The solar cell according to claim 1, wherein a thickness of the thin film layer is ranged between 50-200 nm, and a length of the comb fiber structures is ranged between 500-1500 nm.

3. The solar cell according to claim 1, wherein the polythiophene-based polymer hole transport material is obtained by operations comprising:

vapor polymerization of a thiophene-based hole transport material monomer.

4. The solar cell according to claim 3, wherein the thiophene-based hole transport material monomer comprises one or more of 3,4-ethylenedioxythiophene, 3-hexylthiophene, 3-hexyloxythiophene, or 3-dodecyloxythiophene.

5. The solar cell according to claim 3, wherein the operations further comprise:

after reacting an oxidant with a solution containing a strong acid and the thiophene-based hole transport material monomer, rinsing the hole transport layer with a Lewis acid to remove impurities.

6. The solar cell according to claim 5, wherein the hole transport layer is doped by using an acidic solution or an acidic gas.

7. The solar cell according to claim 1, further comprising an electrode layer, wherein the perovskite absorption layer is provided on the hole transport layer, and the electron transport layer and the electrode layer are provided on the perovskite absorption layer in sequence.

8. The solar cell according to claim 7, wherein the perovskite absorption layer extends into gaps between the comb fiber structures of the hole transport layer to form an embedded structure.

9. The solar cell according to claim 7, wherein a thickness of the hole transport layer is smaller than a thickness of the perovskite absorption layer.

10. The solar cell according to claim 7, wherein a distance between the electron transport layer and a tip of the comb fiber structures of the hole transport layer is no less than 10 nm.

11. The solar cell according to claim 10, wherein a diameter of a comb fiber in the comb fiber structures is ranged between 100-1000 nm, and wherein the comb fiber has a rough surface.

12. A method for forming a solar cell, comprising:

depositing an oxidant on a transparent electrode layer;

forming a hole transport layer having a thin film layer and comb fiber structures on the thin film layer by reacting the oxidant with a solution comprising a strongly polar acid and a thiophene-based hole transport material monomer, wherein a height of a comb fiber structure of the comb fiber structures is greater than a diameter of the comb fiber structure, wherein the hole transport layer is absent of PSS, wherein the diameter of the comb fiber structure is greater than a thickness of the thin film layer;

forming a perovskite absorption layer on the hole transport layer; and forming an electron transport layer and an electrode layer on the perovskite absorption layer in sequence, and wherein a thickness of the perovskite absorption layer is greater than a distance between the electron transport layer and a tip of the comb fiber structures of the hole transport layer.

13. The method according to claim 12, wherein a thickness of the oxidant ranges between 10-60 nm.

14. The method according to claim 12, wherein forming the perovskite absorption layer comprises spin coating a perovskite solution on the hole transport layer, and wherein the perovskite absorption layer extends into gaps between the comb fiber structures.

15. The method according to claim 12, wherein forming the perovskite absorption layer comprises vapor depositing a perovskite precursor on the hole transport layer, and wherein the perovskite absorption layer extends into gaps between the comb fiber structures.

16. The solar cell of claim 1, wherein the polythiophene-based polymer hole transport material comprises one or more of PEDOT, P3HT, P3OHT, or P3ODDT.

17. The method of claim 12, wherein the hole transport layer comprises one or more of PEDOT, P3HT, P3OHT, or P3ODDT.

* * * * *